United States Patent
Wang et al.

(10) Patent No.: US 6,172,318 B1
(45) Date of Patent: Jan. 9, 2001

(54) BASE FOR WIRE BOND CHECKING

(75) Inventors: Chin-Chen Wang, Kaohsiung; Yao-Hsin Feng, Hua Lien; Su Tao, Kaohsiung, all of (TW)

(73) Assignee: Advanced Semiconductor Engineering Inc., Kaohsiung (TW)

( * ) Notice: Under 35 U.S.C. 154(b), the term of this patent shall be extended for 0 days.

(21) Appl. No.: 09/379,313

(22) Filed: Aug. 23, 1999

(51) Int. Cl.[7] .............................. H01L 21/60; G01R 31/04
(52) U.S. Cl. .................... 219/56.21; 228/4.5; 228/56.5
(58) Field of Search .......................... 228/1.1, 4.5, 8–10, 228/56–5, 102, 44.7; 219/56.21, 56.22; 439/66, 81, 428, 700, 824

(56) References Cited

U.S. PATENT DOCUMENTS

| | | | |
|---|---|---|---|
| 3,840,169 | * 10/1974 | Steranko et al. | 19/85.14 |
| 4,413,874 | * 11/1983 | Williams | 439/626 |
| 4,441,248 | * 4/1984 | Sherman et al. | 438/15 |
| 5,031,821 | * 7/1991 | Kaneda et al. | 228/110.1 |
| 5,243,757 | * 9/1993 | Grabbe et al. | 29/882 |
| 5,410,260 | * 4/1995 | Kazama | 324/758 |
| 5,459,672 | * 10/1995 | Cawelti et al. | 364/489 |
| 5,489,854 | * 2/1996 | Buck et al. | 324/761 |
| 5,591,920 | * 1/1997 | Price et al. | 73/828 |
| 5,712,570 | 1/1998 | Heo et al. . | |

* cited by examiner

Primary Examiner—Samuel M. Heinrich
(74) Attorney, Agent, or Firm—Bacon & Thomas

(57) ABSTRACT

A base mainly includes a heating plate and a probe. The probe is attached to the surface of a heating plate which serves to place a substrate having an ball pad on a lower surface facing the probe of the heating plate. The probe contacts the ball pad of the lower surface of the substrate to form a closed loop for wire bond checking while the substrate is placed on the heating plate. When processing the wire bond, the wire connecting the chip and the ball pad of the substrate and the probe connecting to the wire bond checking system form a loop. Then a current is sent to the substrate from the wire bond checking system to check for wire lift bond or missed wire. When the wire bond checking system finds an occurrence of lift bond or missing wire, the wire bonding process stops immediately to avoid unnecessary wire bonding.

5 Claims, 3 Drawing Sheets

US 6,172,318 B1

BASE FOR WIRE BOND CHECKING

BACKGROUND OF THE INVENTION

1. Field of the Invention

The present invention relates generally to a base for wire bond checking and more particularly to a base having an upper surface which arranges a probe thereon serving for wire bond checking.

2. Description of the Related Art

In recent years, as the function of IC becomes complicated, there exists a need in the development of packing for an improved high density lead frame. BGA (Ball Grid Array) packages of the electronic and computer industries have been required to support higher lead counts within the same package footprint area. Lift bonds or missing wires or bonding pads polluted with compound result in an open loop of the BGA package that causes the BGA package to fail to work. Conventional wire bonding systems, without checking wire bonding, cannot stop bonding immediately and open loops occur during wire bonding. So the wire bond system still continues to use unnecessary wire bonds that increase the cost of product.

U.S. Pat. No. 5,712,570, issued on Jan. 27, 1998 to Heo et al., discloses a method for checking the wire bond of a semiconductor package. An electroconductive metal layer of gold or copper is grounded on a chip-bonding portion of a PCB (Printed Circuit Board) of the BGA package as well as on a passage extending between the chip bonding portion and the mold gate of the PCB. After the wire-bonding step, a probe and capillary of a wire bond checking system contact the mold gate and a semiconductor chip, respectively. Then, a current is sent to the BGA package from the checking system to check whether the wire bond is closed or not. When there is neither a lift bond nor a missing wire in the BGA package, the wire will transmit the current. However, the probe of the wire bond checking system needs to move to the ground of the upper surface of the substrate. Then, the probe goes down to the substrate and aims at the ground of the upper surface of the substrate for wire bond checking.

The present invention intends to provide a base having a probe which is arranged on the surface thereof for contacting the ground of the substrate and is also electrically connected with wire bond checking system. In addition, the probe is elastically attached to the base and contacts the ball pads of the lower surface of the substrate for wire bond checking before wire bonding. The probe contacts the ball pads of the lower surface of the substrate for wire bond checking while the substrate is placed on the base, so that the present invention reduces the steps of the probe aiming at the ground of the substrate of U.S. Pat. No. 5,712,570. The present invention needs not aim the probe at the ground since the probe contacts the ball pads of the lower surface of the substrate for wire bond checking while the substrate is placed on the base.

SUMMARY OF THE INVENTION

The primary objective of this invention is to provide a base for wire bond checking which includes a probe contacting the ball pads of the lower surface of the substrate for wire bond checking to reduce the number of steps the probe has to move before wire bonding.

The present invention is a base for wire bond checking in accordance with an embodiment; the base mainly includes a heating plate and a probe. The probe is attached to the surface of the heating plate which serves to place a substrate having ball pads on the lower surface facing the probe of the heating plate. The probe contacts the ball pads of the lower surface of the substrate to form a closed loop for wire bond checking while the substrate is placed on the heating plate. When processing the wire bond, the wire connecting the chip, the ball pads of the substrate and the probe connects to the wire bond checking system form a loop. Then a current is sent to the substrate from the wire bond checking system to check for wire lift bond or missing wire. When the wire bond checking system finds a lift bond or a missing wire, the wire bonding process stops immediately to avoid unnecessary wire bonding.

Other objectives, advantages and novel features of the invention will become more apparent from the following detailed description and the accompanying drawings.

BRIEF DESCRIPTION OF THE DRAWINGS

The present invention will now be described in detail with reference to the accompanying drawings herein.

DETAILED DESCRIPTION OF THE INVENTION

The base of the present invention mainly includes a heating plate and a probe. The probe is attached to the surface of the heating plate which serves to place a substrate that has ball pads on the lower surface facing the probe of the heating plate. The probe contacts the ball pads of the lower surface of the substrate to form a closed loop for wire bond checking while the substrate is placed on the heating plate. When processing the wire bond, the wire connects the chip and the ball pads of the substrate. Then the clamp of the wire bond checking system clamps the wire so as to form a loop of the wire, clamp and probe. After that a current is sent to the substrate from the wire bond checking system to check for wire lift bond or missed wire. When it is assured that the wire connects the chip and the substrate, the clamp cuts the wire and moves to the next predetermined position for wire bonding. When the wire bond checking system finds an occurrence of lift bond or missing wire, the wire bonding process stops immediately to avoid unnecessary wire bonding. A detailed description of the wire bond checking applied in the present invention is described in U.S. Pat. No. 5,712,570. In addition, the elastic member elastically attaches the probe to the edge of the second hole to reduce damage to the substrate while the probe is in contact with the ball pads.

Figure 1:
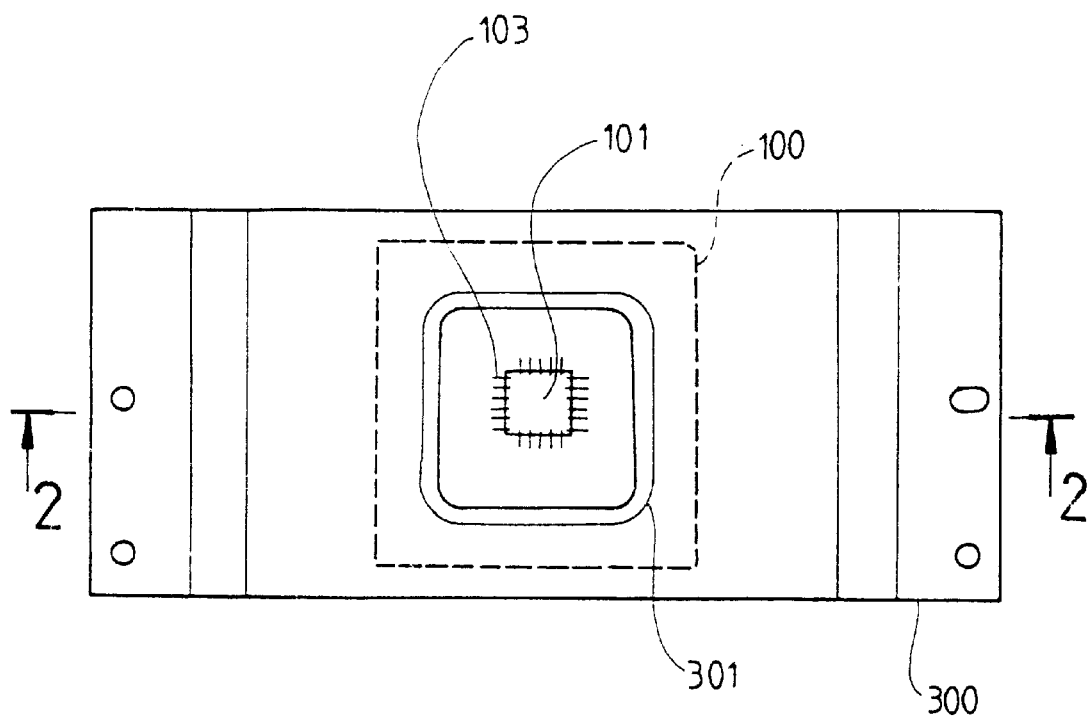
FIG. 1 is a perspective view of a base in accordance with a first embodiment of the present invention.
Figure 2:
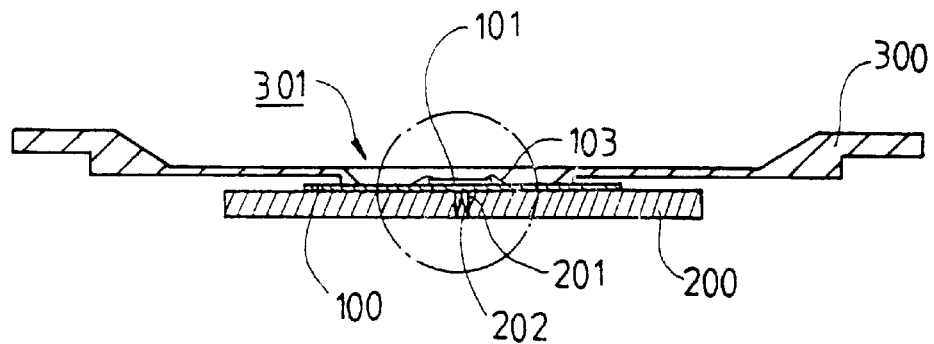
FIG. 2 is a sectional view, taken along 2—2, of the base in accordance with the first embodiment of the present invention.
Figure 3:
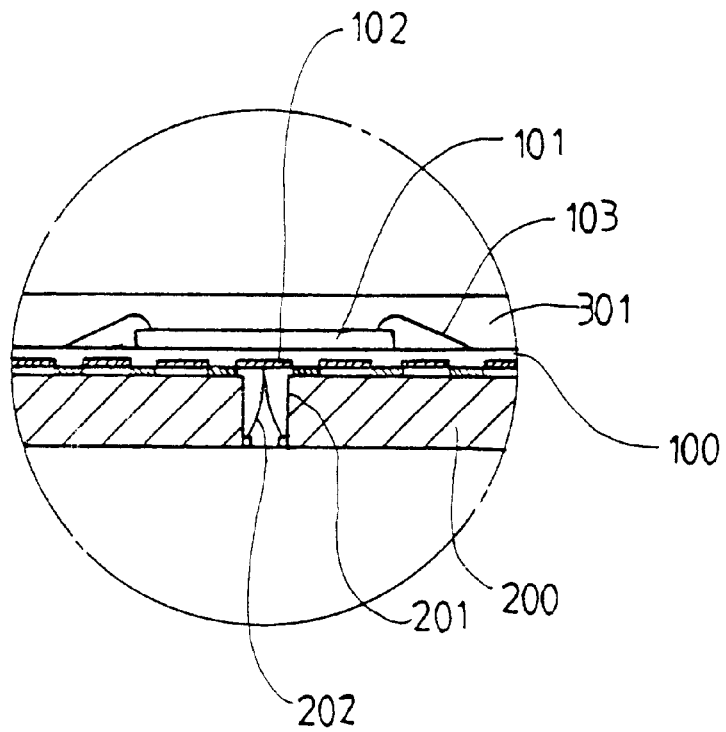
FIG. 3 is an enlarged view of FIG. 2, the base in accordance with the first embodiment of the present invention.

Referring to FIGS. 1, 2 and 3, a base, in accordance with a first embodiment of the present invention, mainly includes a heating plate 200 and a probe 202. The heating plate 200 has a hole 201 and the probe 202 is arranged therein. The base is provided for wire bond checking the substrate 100 which has a chip 101 on the upper surface and a plurality of ball pads 102 (e.g., ground) on the lower surface. The press plate 300 includes a hole 301 which corresponds to a chip 101 of the substrate 100 for wire bonding process. The substrate 100 is placed on the heating plate 200 and pressed by the press plate 300. The chip 101 is then placed in the hole 301 of the substrate 100. And then, the probe 202 contacts the ball pads 102 of the lower surface of the substrate 100 to form a closed loop for wire bond checking. A wire 103 electrically connects the chip 101 to the substrate 100 by wire bonding. Then the clamp of the wire bond checking system (not shown) clamps the wire 103 so as to form a loop of the wire 103, clamp and probe 202. After that a current is sent to the substrate 100 from the wire bond checking system to check for wire lift bond or missed wire. When it is assured that the wire electrically connects the chip 101 and the substrate 100, the clamp cuts the wire and moves to the next predetermined position for wire bonding. When the wire bond checking system finds an occurrence of lift bond or missing wire, the wire bonding process stops immediately to avoid unnecessary wire bonding.

Referring to FIG. 2, the base of the present invention applies to placement of the substrate 100 which has a plurality of ball pads 102 (ground) on the lower surface, and includes the probe 202 which is arranged on the heating plate 200 for contact with the ball pads 102 of the substrate 100. The probe 202 contacts the inner fingers 102 of the substrate 100 while the substrate 100 is placed on the heating plate 200 so as to process wire bond checking. After wire bond checking, the substrate 100 is left on the heating plate 200 to form an opened loop between the substrate and the wire bond checking system. There is no need to move the probe 202 to check and contact the position of the ball pads but the probe 202 automatically connects the ball pads 102 of the substrate 100 during the placement of the substrate 100 placing on the heating plate 200.

Figure 4:
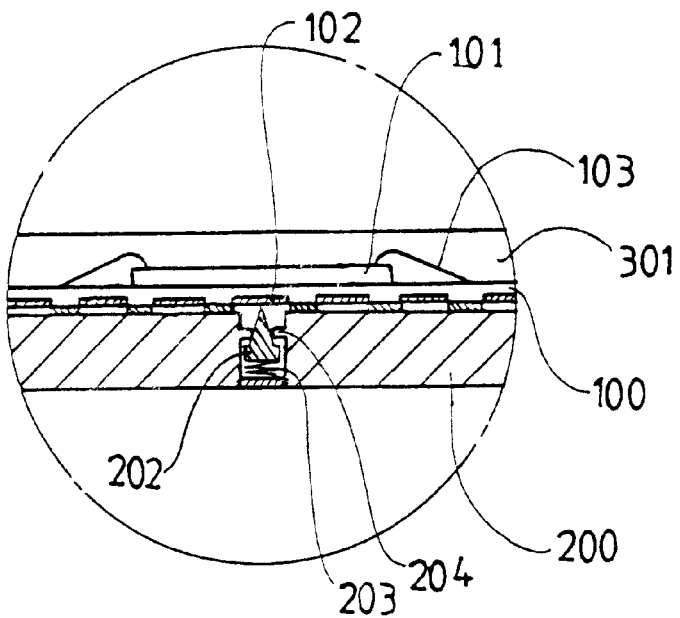
FIG. 4 is an enlarged view of FIG. 2, the base in accordance with the first embodiment of the present invention.

Referring to FIG. 4, a base, in accordance with a second embodiment of the present invention, comprises a heating plate 200 and a probe 202. The heating plate 200 has a hole 201 and the probe 202 is arranged therein. The base is provided for wire bond checking the substrate 100 which has a chip 101 on the upper surface and a plurality of ball pads 102 (e.g., ground) on the lower surface. The hole 201 further comprises a spring 203 and a flange 204. The spring 203 is placed at the bottom of the hole 201 and pushes the body of the probe 202 and the flange 204 restricts the body of the probe 202 to the hole 201.

Figure 5:
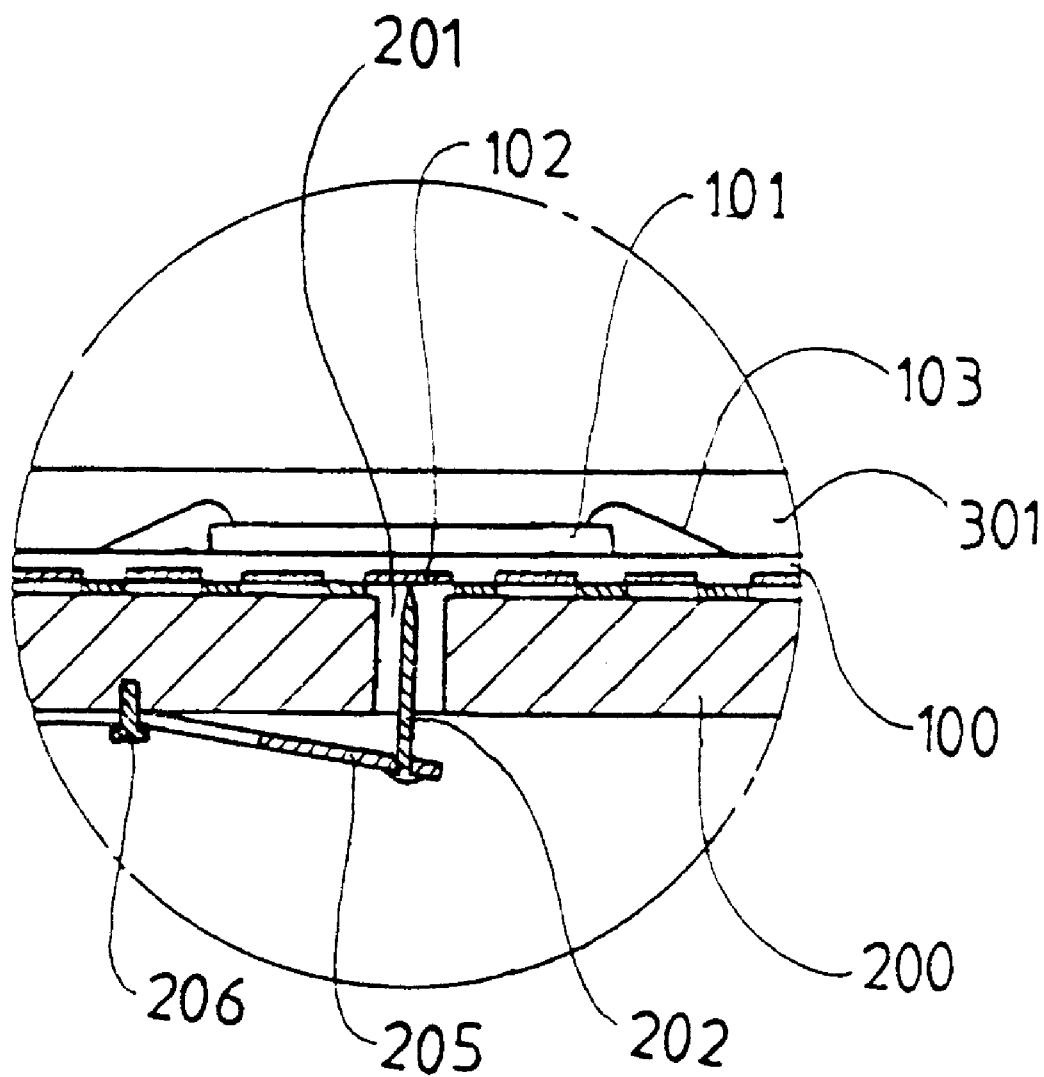
FIG. 5 is an enlarged view of FIG. 2, the base in accordance with the first embodiment of the present invention.

Referring to FIG. 5, a base, in accordance with a third embodiment of the present invention, comprises a heating plate 200 and a probe 202. The heating plate 200 has a hole 201 and the probe 202 is arranged therein. A base is provided for wire bond checking the substrate 100 which has a chip 101 on the upper surface and a plurality of ball pads 102 (e.g. ground) on the lower surface. One end of an elastic member 205 is connected to the bottom of the probe 202, and the other end is attached to the heating plate 200 by a screw 206.

Although the invention has been described in detail with reference to its present preferred embodiment, it will be understood by one of ordinary skill in the art that various modifications can be made without departing from the spirit and the scope of the invention, as set forth in the appended claims.

What is claimed is:

1. A base for wire bonding checking comprising:

a heating plate having a hole formed therein for checking a chip on an upper surface of a substrate placed on said heating plate, a plurality of ball pads being on a lower surface of said substrate; and a probe formed in said hole and being coupled to said ball pad and coupling to a wire bond checking system thereby forming a closed loop for said wire bonding checking.

2. The base of claim 1, wherein said ball pad is coupled to a reference voltage of ground.

3. The base of claim 1, further comprises a press plate having a hole corresponding to said chip to press said substrate.

4. The base of claim 1, further comprises a spring placed at on bottom of said hole for pushing the body of said probe and a flange is provided for restricting said probe.

5. The base of claim 1, further comprises an elastic member connected to said probe at one end and attached on said heating plate by a screw at another end.

* * * * *